(12) United States Patent
Toyosaki et al.

(10) Patent No.: US 6,639,316 B1
(45) Date of Patent: Oct. 28, 2003

(54) ELECTRODE HAVING SUBSTRATE AND SURFACE ELECTRODE COMPONENTS FOR A SEMICONDUCTOR DEVICE

(75) Inventors: Koichi Toyosaki, Yokohama (JP); Akifumi Nakajima, Chiba (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 19 days.

(21) Appl. No.: 09/690,845

(22) Filed: Oct. 18, 2000

Related U.S. Application Data

(63) Continuation of application No. PCT/JP00/00885, filed on Feb. 17, 2000.

(30) Foreign Application Priority Data

Feb. 18, 1999 (JP) .......................................... 11-040277
Feb. 18, 1999 (JP) .......................................... 11-040278

(51) Int. Cl.$^7$ .......................... H01L 23/48; H01L 23/52
(52) U.S. Cl. ...................... 257/748; 257/763; 257/766; 257/769; 257/770
(58) Field of Search ................................ 257/742, 743, 257/744, 745, 747, 748, 751, 763, 764, 766, 767, 768, 769, 770; 438/602, 627, 643, 645, 683, 685

(56) References Cited

U.S. PATENT DOCUMENTS

| | | | |
|---|---|---|---|
| 4,186,410 A | * | 1/1980 | Cho et al. ................... 257/280 |
| 5,077,599 A | * | 12/1991 | Yano et al. .................. 257/753 |
| 5,260,603 A | * | 11/1993 | Damura et al. ............. 257/745 |
| 6,333,945 B1 | * | 12/2001 | Abe et al. ...................... 372/46 |
| 6,403,987 B1 | * | 6/2002 | Miki et al. ..................... 257/99 |

FOREIGN PATENT DOCUMENTS

| | | | |
|---|---|---|---|
| JP | 61108166 A | | 5/1986 |
| JP | 62020348 A | | 1/1987 |
| JP | 63054774 A | | 3/1988 |
| JP | 63156341 A | | 6/1988 |
| JP | 03244128 A | | 10/1991 |
| JP | 5-259107 | * | 10/1993 |
| JP | 8-255767 A | | 10/1996 |
| JP | 09143717 A | | 6/1997 |

* cited by examiner

Primary Examiner—Steven Loke
Assistant Examiner—Hung Kim Vu
(74) Attorney, Agent, or Firm—Oblon, Spivak, McClelland, Maier & Neustadt, P.C.

(57) ABSTRACT

An electrode for a semiconductor device superior in die-bonding and wire-bonding characteristics with a submount and its manufacturing method are provided. The electrode is formed by ohmic-contacting the surface of a semiconductor, which comprises a substrate electrode $E_1$ having a layer structure formed on the surface of the semiconductor and a surface electrode $E_2$ formed by covering the surface and/or side face of the substrate electrode $E_1$. The surface electrode is manufactured by a vacuum evaporation system or sputtering system provided with a holder which is tilted with respect to a material of the surface electrode and able to rotate on its axis and orbit the material.

17 Claims, 4 Drawing Sheets

ELECTRODE HAVING SUBSTRATE AND SURFACE ELECTRODE COMPONENTS FOR A SEMICONDUCTOR DEVICE

This application is a continuation of PCT/JP00/00885 filed Feb. 17, 2000.

FIELD OF THE INVENTION

The present invention relates to an electrode for a semiconductor device, specifically to an electrode for a semiconductor device capable of securing an ohmic contact with a semiconductor constituting a semiconductor device, realizing a superior junction state when die-bonding the semiconductor device to a submount such as a heat sink, and improving the yield in chip manufacture.

DESCRIPTION OF THE BACKGROUND

For example, a GaAs-based semiconductor laser device is generally manufactured as described below.

First, predetermined semiconductors are sequentially epitaxial-grown on a GaAs single-crystal wafer having a predetermined size serving as a substrate to form a semiconductor layer structure. Then, the layer structure is formed into a predetermined pattern, an upper electrode of the predetermined pattern is formed on the uppermost semiconductor layer, and moreover a lower electrode is formed on the back of the waver, that is, the back of the semiconductor substrate.

For these electrodes, a four-layer-structure electrode has been known so far in which an AuGeNi layer is formed on a semiconductor by the vacuum evaporation method or sputtering method, and moreover, an Au layer, an Mo layer, and an Au layer are sequentially formed on the AuGeNi layer.

After the layer structure is formed, the entire wafer is subjected to heat treatment in, for example a nitrogen atmosphere to realize an ohmic contact between the semiconductor layer and the electrode.

Then, the wafer is cleaved and formed into a state in which the desired devices are ranked as parallel bars.

Then, to protect a cleaved plane functioning as a light-emitting end face or specify current and voltage threshold values, an optical output, and a light-emitting direction, a protective film or a reflective film is formed on the cleaved plane. An InGaP film is known as a protective film and a dielectric film made of Si, $SiO_x$, $AlO_x$, $SiN_x$, or $TiO_x$ is known as a reflective film.

Then, the bar is separated into an element with the desired shape and the element is formed into an element chip by using an Au—Sn foil and thereby die-boding or wire-bonding the element to a submount such as a heat sink.

In the above chip manufacturing process, an electrode formed on the surface of a semiconductor is exposed to a heating environment when obtaining an ohmic contact with a semiconductor layer, forming a protective film or a reflective film on a cleaved plane, or die-bonding or wire-bonding the electrode to submount.

Particularly, when forming the above protective film or reflective film, an electrode material is thermally changed in property because the applied temperature while the above film is formed is comparatively high or the electrode material is changed in property because it reacts with a material for forming the film in many cases.

For example, a film-forming temperature to be applied to form a protective film of InGaP on a cleaved plane is approx. 500° C. Therefore, in the case of the above four-layer-structure electrode, Ga component of the semiconductor layer violently diffuses up to the uppermost Au layer by breaking through the Mo layer and may result in Au—Ga alloy.

Moreover, when die-bonding or wire-bonding the electrode with a submount by using an Au—Son foil, the junction state between them becomes incomplete because the difference between the melting points of the Au—Sn foil and the Au—Ga alloy is too large and resultantly, the yield of chips is lowered.

Moreover, in the case of the above four-layer-structure electrode, holes may be formed on the entire surface of the electrode because low-melting-point Ge causes bumping when forming a protective film or reflective film though the above phenomenon rarely occurs. However, when the above phenomenon does occur, a source gas used to form a protective film or reflective film diffuses to the entire electrode through the holes and causes change in the properties of the electrode.

SUMMARY OF THE INVENTION

The present invention is to solve the above-described problems with an electrode for a semiconductor device and its object is to provide a new electrode for a semiconductor device which does not cause a thermal property change when forming a protective film or a reflective film is being formed and which thereby closely contacts the other material in die-bonding or wire-bonding with a submount and its manufacturing method.

DETAILED DESCRIPTION OF THE PREFERRED EMBODIMENT

To achieve the above object, the present invention provides an electrode for a semiconductor device comprising:

a substrate electrode formed by an ohmic contact with a surface of a semiconductor, said substrate electrode constituting a layer structure on the surface of the semiconductor; and a surface electrode formed by covering the surface and/or a side face of said substrate electrode.

Specifically, the present invention provides an electrode for a semiconductor device in which said substrate electrode is constituted of a layer structure obtained by laminating a layer made of AuGeNi, a layer made of at least one kind of material selected from a group of Mo, Cr, and W, and a layer made of at least one kind of material selected from a group of Pt and Pd in this order, and said surface electrode is constituted of a layer structure obtained by laminating a layer made of at least one kind of material selected from a group of Mo, Cr and W, and a layer made of an Au layer in this order.

Preferably, the present invention provides an electrode for a semiconductor device in which said substrate electrode is constituted of a layer structure obtained by laminating an AuGeNi layer, an Mo layer and a Pt layer in this order, and said surface electrode is constituted of a layer structure obtained by laminating an Mo layer and an Au layer in this order.

Moreover, the present invention provides an electrode for a semiconductor device in which said substrate electrode is constituted of a layer structure obtained by laminating an AuGe layer, an Ni layer, and a layer made of at least one kind of material selected from a group of Mo, Cr, and W and a layer made of at least one kind of material selected from a group of Pt and Pd in this order, and said surface electrode is constituted of a layer structure obtained by laminating a layer made of at least one kind of material selected from a group of Mo, Cr, and W and an Au layer in this order.

Preferably, the present invention provides an electrode for a semiconductor device in which said substrate electrode is constituted of a layer structure obtained by laminating an AuGe layer, an Ni layer, an Mo layer and a Pt layer in this order, and said surface electrode is constituted of a layer structure obtained by laminating an Mo layer and an Au layer in this order.

Moreover, the present invention provides a method of manufacturing an electrode for a semiconductor device, said method comprising steps of:

setting a semiconductor on a holder of a vacuum evaporation system or a sputtering system, covering a surface of the semiconductor with an electrode material in accordance with a vacuum evaporation method or sputtering method, thereby forming a substrate electrode of a layer structure and a surface electrode for covering the surface and/or a side face of said substrate electrode, wherein a vacuum evaporation system or a sputtering system provided with a holder which is tilted from a set position of the electrode material and which can be rotated about an axis thereof and orbited is used to form said surface electrode.

BEST MODE FOR CARRYING OUT THE INVENTION

Figure 1:
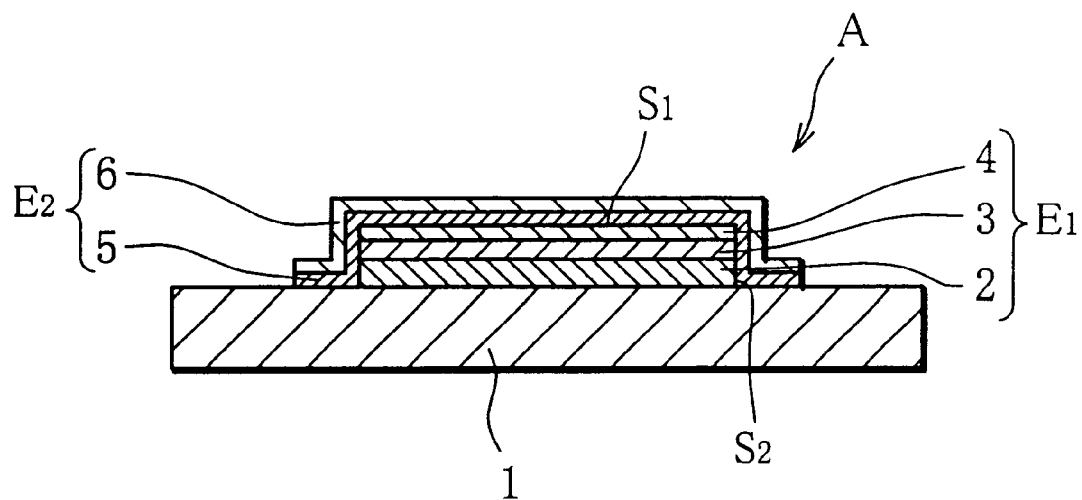
FIG. 1 is a sectional view showing a layer structure of an electrode A of the present invention.

FIG. 1 shows an Embodiment A of an electrode of the present invention.

In the case of the electrode A, a three-layer structure constituted of an AuGeNi layer 2 having a thickness of 50 to 200 nm, an Mo layer 3 having a thickness of 50 to 200 nm, and a Pt layer 4 having a thickness of 50 to 200 nm are formed on a semiconductor layer 1 as a substrate electrode $E_1$, the layer 1 constituting an uppermost layer of a semiconductor device. Then, an ohmic contact state is maintained between the AuGeNi layer 2 and the semiconductor layer 1.

Moreover, a surface electrode $E_2$ is formed of a two-layer structure of an Mo layer having a thickness of 50 to 200 nm and an Au layer 6 having a thickness of 100 to 500 nm by covering a surface $S_1$ and a side face $S_2$ of the substrate electrode $E_1$.

In a case that the semiconductor layer 1 is made of GaAs, the Mo layer 3 and Pt layer 4 of the substrate electrode $E_1$ serve as barrier layers against Ga component diffused from the semiconductor layer 1 when a protective film or a reflective film is formed. Therefore, the layer s 3 and 4 are provided for improving a die-bonding characteristic or wire-bonding characteristic of an electrode by preventing properties of the Au layer 6 from changing due to diffusion of the Ga component.

Moreover, the Mo layer 5 of the surface electrode $E_2$ covers the AuGeNi layer 2 and the Pt layer exposed to the side face $S_2$ of the substrate electrodes $E_1$. Thus, the Mo layer 5 serves as a barrier layer for preventing a source gas, which contains In, Ga, and P used to form, for example, an InGaP protective film, from reacting with the electrode material of the above two layers 2 and 4 and thereby, prevents properties of the substrate electrode $E_1$ from changing.

The layer structure of the electrode A suffers deterioration in the function of the barrier layer when thicknesses of the Mo layer 3 and Mo layer 5 are too small. On the other hand, the electrode structure may be broken due to an accumulated stress in forming a film when the thicknesses are too large though depending on the thickness of other layers. Therefore, it is preferable that the thicknesses of the layer 3 and 5 are normally kept in a range of 50 to 200 nm as described above.

Moreover, it is preferable to further form an Au layer between the AuGeNi layer 2 and Mo layer 3 of the substrate electrode $E_1$ because the die-bonding or wire-bonding characteristic of the whole electrode is improved.

Figure 2:
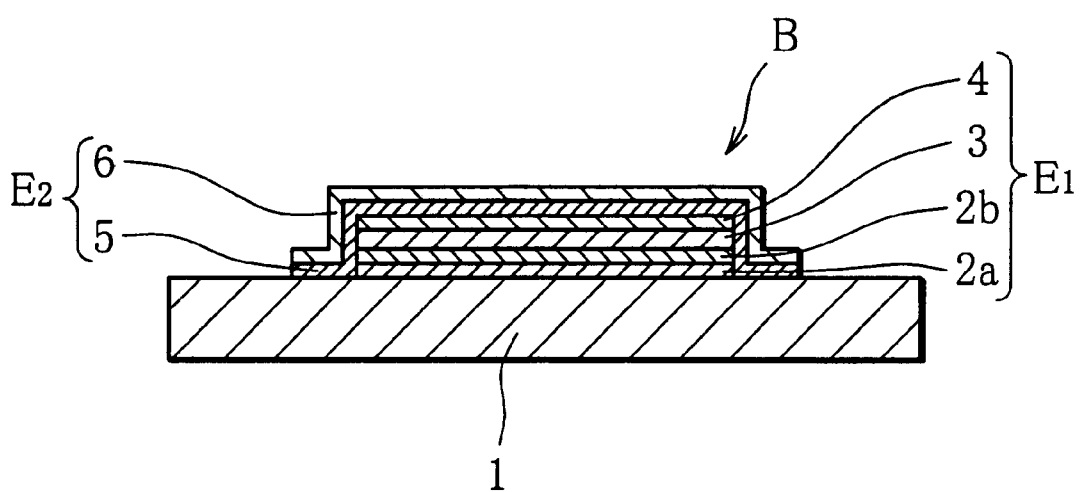
FIG. 2 is a sectional view showing a layer structure of an electrode B of the present invention.

FIG. 2 shows another electrode B of the present invention.

The layer structure of the electrode B is the same as that of the electrode A except that the AuGeNi layer 2 of the electrode A is constituted of a two-layer structure.

That is, an AuGe layer 2a is first formed on the surface of the semiconductor layer 1 and an Ni layer 2b is formed on the layer 2a. According to the function of the Ni layer 2b, the above-described layer structure is effective because it is possible to prevent a hole from being formed in an electrode due to bumping of Ge which rarely occurs when a protective layer or reflective layer is formed.

In the case of the layer structure of the electrode B, it is also permitted to further form an Au layer having a thickness of 20 to 100 nm between the Ni layer 2b and the Mo layer 3.

In the case of the above-described electrodes A and B, the barrier layer includes the Mo layers 3 and 5, and the single layer 4 made of Pt. However, it is also permitted to use a Cr layer or W layer instead of the Mo layers 3 and 5 and moreover, use a layer formed by laminating or alloying two or more of Mo, Cr, and W. Further, it is permitted to use a layer made of Pd instead of the Pt layer 4 or a layer formed by laminating or alloying Pt and Pd.

The above electrodes A and B are manufactured as described below.

First, though it is possible to use a resistive-heating or electron-beam-heating vacuum evaporation system or a sputtering system as a manufacturing system for the electrodes A and B, a case of using the electron-beam-heating vacuum evaporation system is described below.

To manufacture the electrodes of the above-described structure, a system used to form the substrate electrode $E_1$ is not restricted particularly. However, a system used to form the surface electrode $E_2$ has structural features to be described later.

Figure 3:
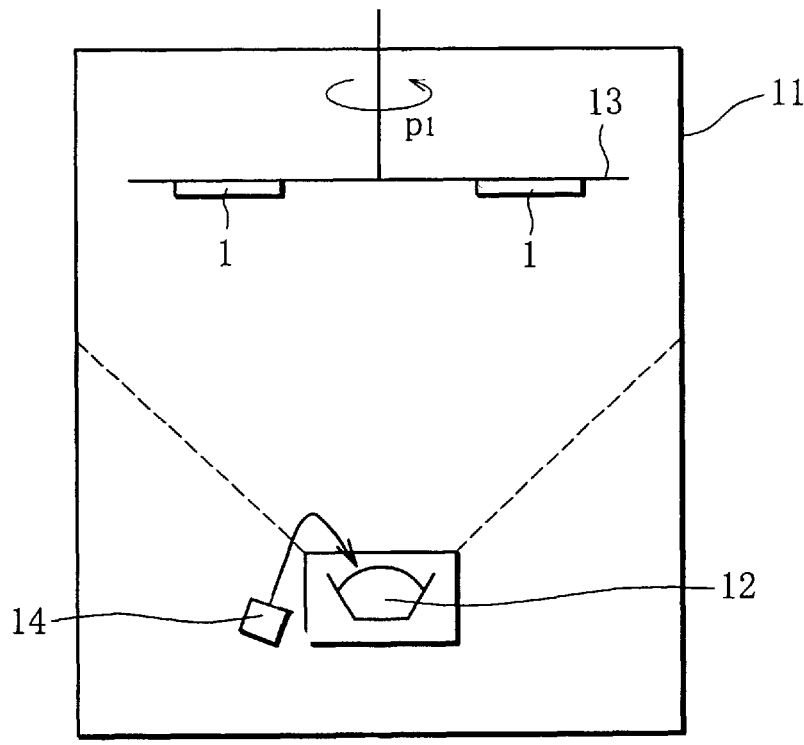
FIG. 3 is a schematic view showing a parallel-plate vacuum evaporation system used to form a substrate electrode of the electrode of the present invention.

For example, FIG. 3 shows a system for forming the substrate electrode $E_1$ that has a parallel-plate holder. In the case of this system, as its outline is shown in FIG. 3, a vessel for storing a predetermined electrode material 12 is set in a vacuum housing 11 and a holder 13 is set above the electrode material 12 in parallel with the electrode material 12 so as to be able to rotate in the direction of an arrow $P_1$.

Moreover, a substrate or semiconductor wafer 1 on which an electrode will be formed is set on the lower face of the holder 13 so that the surface of the wafer 1 can be orbited above the electrode material 12 while facing the electrode material 12 in parallel.

To form the substrate electrode $E_1$, the inside of the vacuum housing 11 is set at a predetermined vacuum degree and an electron beam is applied to the electrode material 12 from an electron-beam gun 14 while rotating the holder 13 on which the semiconductor wafer 1 is set so that the electrode material 12 is radially evaporated.

The electrode material 12 is sequentially deposited on the surface of the semiconductor wafer 1 in the vertical direction up to a desired thickness.

Then, by repeating formation of a next layer on the above layer through the same operation, the substrate electrode $E_1$ having a desired layer structure is formed.

Figure 4:
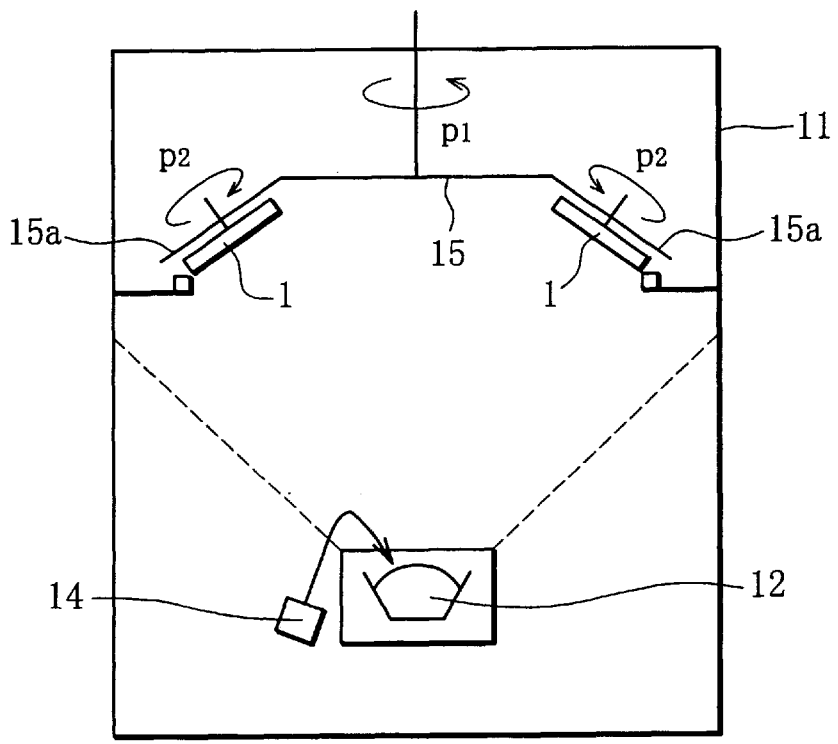
FIG. 4 is a schematic view of a vacuum evaporation system use to form a surface electrode for the electrodes A and B of the present invention.

Then, the surface electrode $E_2$ is formed by using a system whose outline is shown in FIG. 4.

In the case of this system, a holder has the following structure because it is necessary to cover the surface $S_1$ and the side face $S_2$ of the substrate electrode $E_1$ with an electrode material at the same time.

That is, the holder 15 has a tilt portion 15 along the circumference thereof. The tilt portion 15a tilts at a predetermined angle with respect to the electrode material 12. The whole of the holder 15 is able to rotate in the direction of an arrow $P_1$ in FIG. 4. A substrate or wafer 1 with the substrate electrode $E_1$ already formed is set on the tilt portion 15a and can rotate in the direction of an arrow $P_2$ in FIG. 4.

Therefore, by setting the wafer 1 on the tilt portion 15a, the substrate electrode $E_1$ formed on the wafer 1 rotates on its axis while facing the electrode material 12 under a tilted state and receives a flow of the electrode material 12 while orbiting in the system.

As a result, the electrode material 12 is deposited on the surface $S_1$ of the substrate electrode $E_1$ and at the same time, it is also deposited on the side face $S_2$ slanting with respect to the flow of the electrode material so that formation of a desired layer covering the surface $S_1$ and side face $S_2$ of the substrate electrode $E_1$ progresses.

Figure 5:
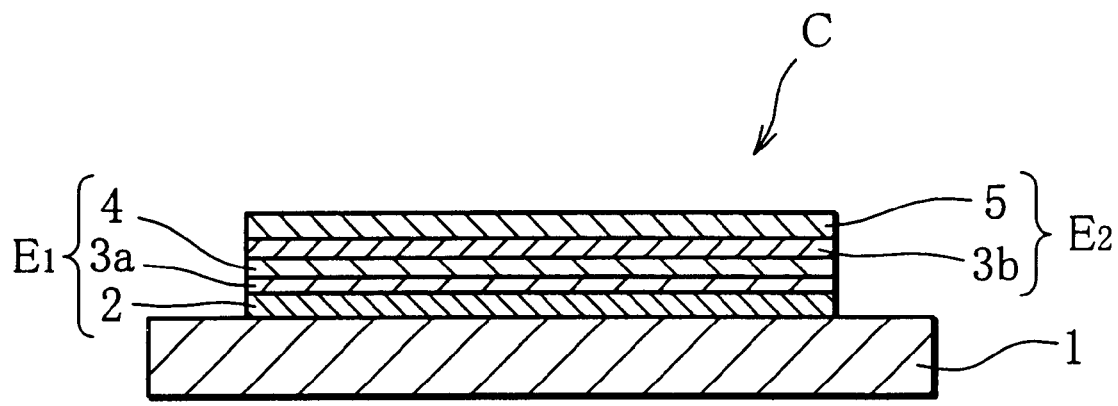
FIG. 5 and FIG. 7 are a sectional view showing a layer structure of an electrode C of the present invention.

FIG. 5 is still another example of electrode C of the present invention.

In the case of the electrode C, a substrate electrode $E_1$ comprising an AuGeNi layer 2, an Mo layer 3a and a Pt layer 4 is formed on a surface of a semiconductor 1 constituting the uppermost layer of a semiconductor device and moreover, a surface electrode $E_2$ comprising an Mo layer 3b and an Au layer 5 is formed only on the surface of the substrate electrode $E_1$. Then, an ohmic contact is maintained between the layers and between surfaces of the AuGeNi layer 2 and semiconductor 1, respectively.

In a case that the semiconductor 1 is made of GaAs, the three-layer structure of double-layered Mo layers 3a and 3b and the Pt layer 4 lying between the layers 3a and 3b serves as a barrier layer against Ga component diffused and prevents the uppermost Au layer 5 from changing in property due to diffusion of the Ga component. Moreover, when forming a protective film made of InGaP, the barrier layer prevents a source gas containing In, Ga, and P from reacting with the uppermost Au layer 5.

Therefore, even when a submount is die-bonded or wire-bonded to the electrode C, the junction between them improves and the yield of manufactured chips improves.

Regarding the layer structure of the electrode C, when thicknesses of the Mo layer 3a, Pt layer 4 and Mo layer 3b constituting the barrier layer are too small, the above effect is not completely achieved. On the other hand, when the thicknesses are too great, the whole layer structure is broken due to an accumulated stress during the process of forming a film. Therefore, it is preferable to set the thickness of the Mo layer 3a at 50 to 200 nm, that of the Pt layer 4 is set at 50 to 200 nm, and that of the Mo layer 3b is set at 50 to 200 nm. As to this barrier layer, it is necessary that the Pt layer 4 be located between the double Mo layers. If the layer sequence is changed, the above effect is not obtained.

Moreover, as for the layer structure of the electrode C, the same effect is also obtained by forming an Au layer having a thickness of 20 to 100 nm between the AuGeNi layer 2 and the Mo layer 3a.

Figure 6:
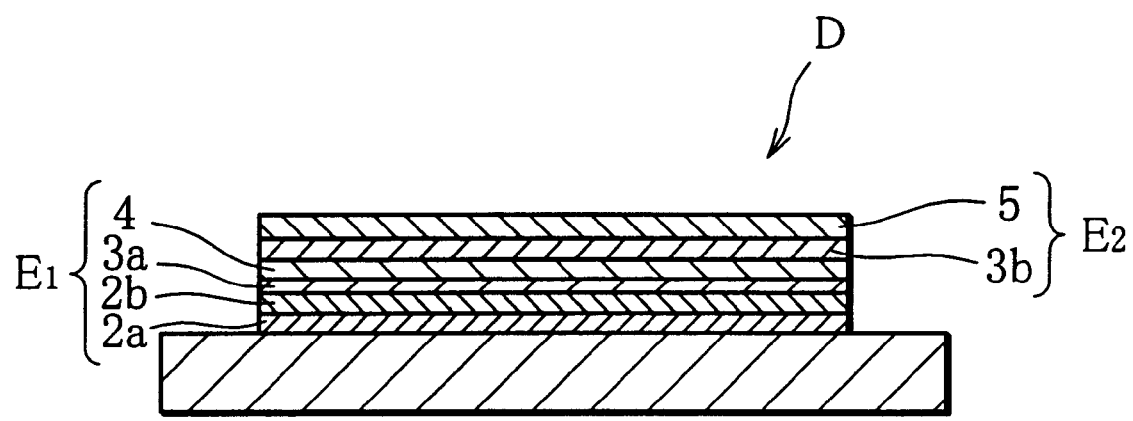
FIG. 6 and FIG. 8 are a sectional view showing a layer structure of an electrode D of the present invention.
Figure 7:
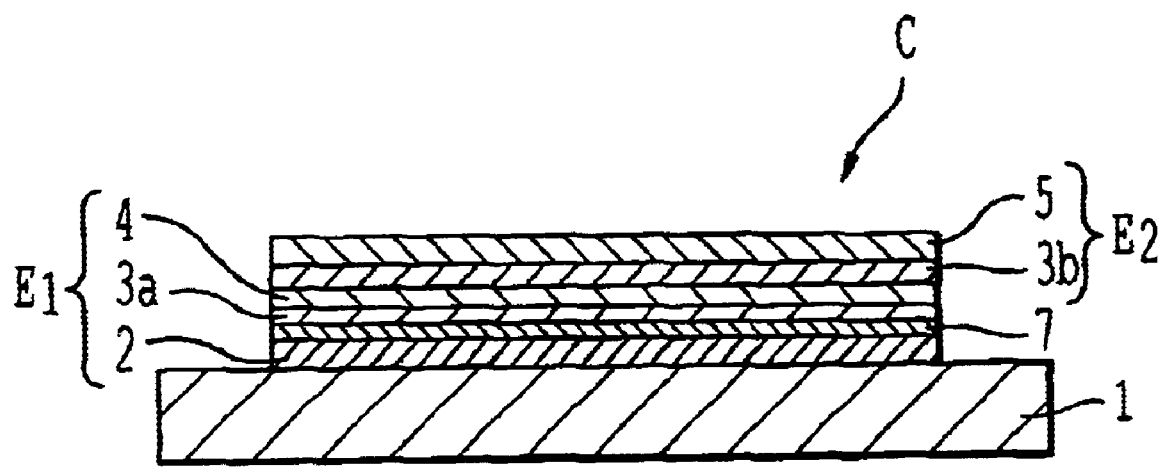
Figure 8:
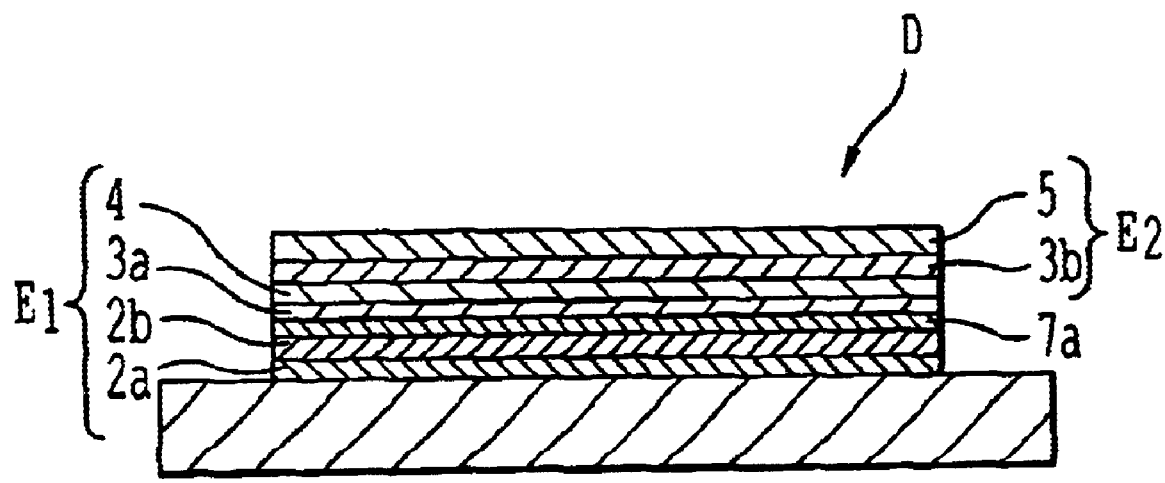

FIG. 6 shows still another electrode D.

A layer structure of the electrode D is the same as that of the electrode C except that the AuGeNi layer 2 of the electrode C is formed into a double-layer structure.

That is, an AuGe layer 2a is first formed on the surface of a semiconductor 1 and an Ni layer 2b is formed on the layer 2a. Use of this layer structure is effective because it is possible to prevent a hole from being formed due to the bumping of Ge which rarely occurs when forming a protective layer or reflective film.

Also in the case of the layer structure of the electrode D, it is permitted to further form an Au layer having a thickness of 20 to 100 nm between the Ni layer 2b and Mo layer 3a.

Both electrodes C and D can be manufactured by the vacuum evaporation method using a resistive heating or electron-beam-heating, or the sputtering method. In this case, because it is unnecessary to cover the side face of the substrate electrode $E_1$ with the surface electrode $E_2$, it is permitted to form the substrate electrode $E_1$ and surface electrode $E_2$ by a system having the structure shown in FIG. 3.

In the case of the above electrodes C and D, the barrier layer includes the Mo layers 3a and 3b, and the single layer 4 made of Pt. However, it is also permitted to use a Cr layer or a W layer instead of the Mo layers 3a and 3b or a layer formed by laminating or alloying two or more of Mo, Cr, and W. Moreover, it is permitted to use a layer made of Pd or a layer formed by laminating or alloying Pt and Pd instead of the Pt layer 4.

EXAMPLES 1 AND 2 AND COMPARATIVE EXAMPLE 1

The electrode A shown in FIG. 1 was manufactured as described below.

Pretreatment such as oxide-film removal was applied to a GaAs wafer and then the wafer was set on the holder 13 of the parallel-plate vacuum evaporation system shown in FIG. 3, the inside of the system was set at a vacuum degree of $5 \times 10^{-5}$ Pa, and an AuGeNi alloy layer was deposited on the surface of the wafer 1 by operating the electron-beam gun 14 while rotating the holder 13 at approx. 15 rpm so that an AuGeNi alloy layer 2 having a thickness of 100 nm was formed on the surface of the wafer 1.

Then, another electrode material was used, and an Mo layer 3 having a thickness of 100 nm and a Pt layer 4 having a thickness of 100 nm were sequentially formed on the AuGeNi alloy layer 2 to form a substrate electrode $E_1$. It is needless to say that each layer was formed after a vacuum degree recovered.

Then, the obtained wafer was set on the holder tilt portion 15a of the system shown in FIG. 4, the inside of the system was set at a vacuum degree of $5 \times 10^{-5}$ Pa, and an Mo layer 5 having a thickness of 100 nm and an Au layer 6 having a thickness of 300 nm were sequentially deposited on the wafer 1 by operating the electron-beam gun 14 while rotating the whole holder and the wafer 1 at about 15 rpm and at approx. 75 rpm, respectively, to form a surface electrode $E_2$.

Then, heat treatment was applied to the wafer in a nitrogen-atmosphere furnace at a temperature of 420° C. for 2 minutes to form an ohmic contact state between the wafer and each layer.

The obtained wafer was cleaved like a bar and an InGaP protective film was formed on the cleaved plane at a film-forming temperature of 500° C. by using TMIn, TEGa, and $PH_3$ as source gases.

Then, the bar was cleaved and separated into a total of 100 devices (Example 1).

On the other hand, a device (Example 2) was manufactured in a manner similar to that of the case of Example 1 except for forming the electrode C having the layer structure shown in FIG. 5 by sequentially forming an AuGeNi layer having a thickness of 100 nm, an Mo layer having a thickness of 100 nm, a Pt layer having a thickness of 100 nm, an Mo layer having a thickness of 100 nm, and an Au layer having a thickness of 300 nm on the surface of the GaAs wafer by using the system shown in FIG. 3. In the case of the electrode C of this device, the layer structure in the vertical direction is the same as the one of Example 2 structure but the side face is not covered with the surface electrode $E_2$ of Example 1.

For comparison, a device (Comparative example 1) was manufactured in a manner similar to that of the case of Example 2 except that the layer structure of an electrode was a four-layer structure comprising an AuGeNi layer having a thickness of 100 nm, an Au layer having a thickness of 50 nm, an Mo layer having a thickness of 100 nm, and an Au layer having a thickness of 300 nm.

Then, each of these three types of devices was die-bonded with heat sinks at a temperature of 270 to 300° C. by using a foil made of an Au-70–80%Sn alloy and then a die shear test of each chip was performed.

As a result, in the case of chips having the electrode A of Example 1, cleavage breakdown occurred at the interface between the AuGeNi layer and the GaAs substrate of the electrode A in approx. 90 chips. However, approx. 80 chips have the cleavage breakdown in the case of the electrode C of Example 2 and 0 chip have the cleavage breakdown in the case of the electrode of Comparative example 1. More specifically, the cleavage breakdown occurred on the interface between the Au layer which is the uppermost layer of the electrode and the heat sink.

This shows that the interface between the electrode and the GaAs substrate cannot withstand stress due to the above test because the adhesiveness between the electrodes A and C and the heat sink improved in the case of Examples 1 and 2. That is, it is shown that no change in property of an electrode material occur in the heat treatment process and the die-bonding characteristics are superior.

As a result of checking the electrode C of Example 2, it was confirmed that Ga, In and P which are source gas components when forming an InGaP film diffuse from the side face of the layer structure into the AuGeNi layer and Pt layer.

As a result of raising the temperature when forming the above InGap protective film to 520° C., a little micro notches are found on uppermost layers of the electrodes A and C and it was deduced that bumping of Ge had occurred.

EXAMPLE 3

The electrode B shown in FIG. 2 was formed in the manner as described below.

A wafer having the same electrode structure as the case of Example 1 was manufactured except for first forming an AuGe layer 2a having a thickness of 85 nm and forming an Ni layer 2b having a thickness of 15 nm on the layer 2a when the substrate electrode $E_1$ of Example 1 was formed.

Then, the same treatment as in the case of Example 1 was applied to the wafer to manufacture chips and a die shear test was applied to the obtained chips as in the case of Example 1.

As a result, shear fracture occurred at the interface between the electrode and the surface of the GaAs substrate in almost all chips and a die-bonding characteristic superior to the case of Example 1 was shown.

Moreover, though the temperature for forming the InGaP protective film was raised to 520° C. in the above process, the uppermost layer of the electrode was a smooth plane and it was confirmed that bad influences of bumping of Ge on the surface had been prevented by the Ni layer.

EXAMPLE 4

The electrode D shown in FIG. 6 was manufactured in the manner as described below.

Pretreatment such as oxide-film removal was applied to a GaAs wafer and thereafter, an AuGe alloy layer having a thickness of 85 nm, an Ni layer having a thickness of 15 nm, an Mo layer having a thickness of 100 nm, a Pt layer having a thickness of 100 nm, an Mo layer having a thickness of 100 nm, and an Au layer having a thickness of 300 nm were sequentially formed on the surface of the GaAs wafer by using an electron-beam-resistive-heating-type vacuum evaporation system.

Then, the same treatment as in the case of Example 2 was applied to the wafer to manufacture chips and a die shear test was applied to the obtained chips similarly to the case of Example 2.

As a result, shear fracture occurred at the interface between the electrode and the surface of the GaAs substrate in approx. 90 chips and a die-bonding characteristic superior to that of the case of the electrode C of Example 2 was shown.

Moreover, though the temperature for forming the InGaP protective film was raised to 520° C. in the above process, the uppermost layer of the electrode was a smooth plane and it was confirmed that bad influences of bumping of Ge on the surface had been prevented by an Ni layer.

Each of these examples used a GaAs substrate. A semiconductor on which an electrode would be formed was not restricted to the above GaAs single-crystal substrate. It was also possible to obtain the same effect from a film made of a III–V-group compound semiconductor or II–V-group compound semiconductor such as epitaxially-grown GaAs, AlGaAs, GaP, InGaAs, AlInGaP, or GaN in addition to an InP single-crystal substrate or GaP single-crystal substrate. Moreover, not only a semiconductor but also a sapphire substrate, Si substrate, and SiN substrate were effective.

INDUSTRIAL APPLICABILITY

As described above, an electrode for a semiconductor device of the present invention does not suffer a thermal property change even if heat treatment is applied to the electrode when forming a protective film or reflective film under manufacture of a device. Therefore, the electrode is superior in die-bonding and wire-bonding characteristics with a submount and improves the yield of desired chips, and therefore, has a very great industrial value.

What is claimed is:

1. An electrode for a semiconductor device comprising:
a) a substrate electrode formed on a surface of a semiconductor by ohmic-contacting the surface of the semiconductor, said substrate electrode having a layer structure; and
b) a surface electrode formed to cover a top surface and all side faces of said substrate electrode, wherein said substrate electrode has a layer structure obtained by laminating a layer made of at least one selected from the group consisting of Mo, Cr, and W; and a layer made of at least one selected from the group consisting of Pt and Pd; in this order, said surface electrode having a lowest layer made of at least one selected from the group consisting of Mo, Cr, and W; said lowest layer covering the top surface and all the side faces of said substrate electrode.

2. An electrode for a semiconductor device comprising:
a) a substrate electrode formed on a surface of a semiconductor by ohmic-contacting the surface of the semiconductor, said substrate electrode having a layer structure; and
b) a surface electrode formed to cover a top surface and all side faces of said substrate electrode, wherein said substrate electrode has a layer structure obtained by laminating a layer made of AuGeNi; a first layer made of at least one selected from the group consisting of Mo, Cr, and W; and a layer made of at least one selected from the group consisting of Pt and Pd; in this order; and
said surface electrode having a layer structure obtained by laminating a second layer made of at least one selected from the group consisting of Mo, Cr, and W and an Au layer in this order.

3. The electrode of claim 2, wherein
a second Au layer interposed is between the AuGeNi layer and the first layer made of at least one selected from the group consisting of Mo, Cr and W of said substrate electrode.

4. An electrode for a semiconductor device comprising:
a) a substrate electrode formed on a surface of a semiconductor by ohmic-contacting the surface of the semiconductor, said substrate electrode having a layer structure; and
b) a surface electrode formed to cover a top surface and all side faces of said substrate electrode, wherein said substrate electrode has a layer structure obtained by laminating an AuGeNi layer, a first Mo layer and a Pt layer in this order; and
said surface electrode having a layer structure obtained by laminating a second Mo layer and an Au layer in this order.

5. The electrode of claim 4, wherein
a second Au layer is formed between the AuGeNi layer and the first Mo layer of said substrate electrode.

6. An electrode for a semiconductor device comprising:
a) a substrate electrode formed on a surface of a semiconductor by ohmic-contacting the surface of the semiconductor, said substrate electrode having a layer structure; and
b) a surface electrode formed to cover a top surface and all side faces of said substrate electrode, wherein said substrate electrode has a layer structure obtained by laminating an AuGe layer; an Ni layer; a first layer made of at least one selected from a group consisting of Mo, Cr, and W; and a layer made of at least one selected from the group consisting of Pt and Pd; in this order, and
said surface electrode having a layer structure obtained by laminating a second layer made of at least one selected from the group consisting of Mo, Cr, and W; and an Au layer, in this order.

7. The electrode of claim 6, wherein
a second Au layer is interposed between the Ni layer and the first layer made of at least one selected from the group consisting of Mo, Cr and W of said substrate electrode.

8. An electrode for a semiconductor device comprising:
a) a substrate electrode formed on a surface of a semiconductor by ohmic-contacting the surface of the semiconductor, said substrate electrode having a layer structure; and
b) a surface electrode formed to cover a top surface and all side faces of said substrate electrode, wherein said substrate electrode has a layer structure obtained by laminating an AuGe layer, an Ni layer, a first Mo layer, and a Pt layer in this order, said surface electrode having a layer structure obtained by laminating a second Mo layer and an Au layer in this order.

9. The electrode of claim 8, wherein
a second Au layer is interposed between the Ni layer and the first Mo layer of said substrate electrode.

10. An electrode for a semiconductor device formed on a surface of the semiconductor by ohmic-contacting the surface of the semiconductor, said electrode comprising:
a layer structure obtained by laminating a first layer made of least one selected from the group consisting of Mo, Cr and W; a layer made of at least one selected from the group consisting of Pt and Pd; and a second layer made of at least one selected from the group consisting of Mo, Cr and W; in this order, wherein said layer structure comprises
a first layer structure obtained by laminating an AuGeNi layer; the first layer made of at least one selected from the group consisting of Mo, Cr and W; and the layer made of at least one selected from the group consisting of Pt and Pd; in this order; and
a second layer structure obtained by laminating the second layer made of at least one selected from the group consisting of Mo, Cr and W and an Au layer, in this order.

11. The electrode of claim 10, wherein
a second Au layer is interposed between the AuGeNi layer and the first layer made of at least one selected from the group consisting of Mo, Cr and W of said first layer structure.

12. An electrode for a semiconductor device formed on a surface of the semiconductor by ohmic-contacting the surface of the semiconductor, said electrode comprising:

a layer structure obtained by laminating a first layer made of least one selected from the group consisting of Mo, Cr and W; a layer made of at least one selected from the group consisting of Pt and Pd; and a second layer made of at least one selected from the group consisting of Mo, Cr and W; in this order, wherein said layer structure comprises
- a first layer structure obtained by laminating an AuGeNi layer, a first Mo layer, and a Pt layer in this order, and
- a second layer structure obtained by laminating a second Mo layer and an Au layer in this order.

13. The electrode of claim 12, wherein a second Au layer is interposed between the AuGeNi layer and the first Mo layer of said first layer structure.

14. An electrode for a semiconductor device formed on a surface of the semiconductor by ohmic-contacting the surface of the semiconductor, said electrode comprising:

a layer structure obtained by laminating a first layer made of least one selected from the group consisting of Mo, Cr and W; a layer made of at least one selected from the group consisting of Pt and Pd; and a second layer made of at least one selected from the group consisting of Mo, Cr and W; in this order, wherein said layer structure comprises
- a first layer structure obtained by laminating an AuGe layer, an Ni layer, the first layer made of at least one selected from the group consisting of Mo, Cr and W; and the layer made of at least one selected from the group consisting of Pt and Pd in this order; and a second layer structure obtained by laminating the second layer of at least one selected from a group consisting of Mo, Cr and W; and an Au layer in this order.

15. The electrode of claim 14, wherein:

a second Au layer is interposed between the Ni layer and the first layer made of at least one selected from the group consisting of Mo, Cr, and W of said first layer structure.

16. An electrode for a semiconductor device formed on a surface of the semiconductor by ohmic-contacting the surface of the semiconductor, said electrode comprising:

a layer structure obtained by laminating a first layer made of least one selected from the group consisting of Mo, Cr and W; a layer made of at least one selected from the group consisting of Pt and Pd; and a second layer made of at least one selected from the group consisting of Mo, Cr and W; in this order, wherein said layer structure comprises
- a first layer structure obtained by laminating an AuGe layer, an Ni layer, a first Mo layer, and a Pt layer in this order; and
- a second layer structure obtained by laminating a second Mo layer and an Au layer in this order.

17. The electrode of claim 16, wherein a second Au layer is interposed between the Ni layer and the first Mo layer of said first layer structure.

* * * * *